United States Patent [19]
Tanoue et al.

[11] Patent Number: 5,345,639
[45] Date of Patent: Sep. 13, 1994

[54] DEVICE AND METHOD FOR SCRUBBING AND CLEANING SUBSTRATE

[75] Inventors: Kouichi Tanoue; Shinzi Kitamura; Noriyuki Anai; Takami Satoh; Takayuki Tomoeda; Tatsuya Iwasaki; Kengo Mizosaki, all of Kumamoto, Japan

[73] Assignees: Tokyo Electron Limited, Tokyo; Tokyo Electron Kyushu Limited, Tosu, both of Japan

[21] Appl. No.: 69,106

[22] Filed: May 28, 1993

[30] Foreign Application Priority Data

May 28, 1992 [JP] Japan .................................. 4-137160
Oct. 26, 1992 [JP] Japan .................................. 4-287292

[51] Int. Cl.5 ............................................. A46B 13/04
[52] U.S. Cl. ............................................ 15/88.2; 15/77
[58] Field of Search ...................... 15/88.1, 88.2, 88.3, 15/77, 97.1, 102

[56] References Cited

U.S. PATENT DOCUMENTS

| | | | |
|---|---|---|---|
| 4,109,337 | 8/1978 | Hillman et al. | 15/77 |
| 5,081,733 | 1/1992 | Kudo | 15/102 |
| 5,092,011 | 3/1992 | Gommori | 15/97.1 |

FOREIGN PATENT DOCUMENTS

215766  1/1990  Japan .

*Primary Examiner*—Edward L. Roberts
*Attorney, Agent, or Firm*—Oblon, Spivak, McClelland, Maier & Neustadt

[57] ABSTRACT

A substrate scrubbing and cleaning device comprising a mechanism having an upper and a lower brush members for scrubbing both surfaces of an LCD glass substrate, a mechanism for rotating the upper and lower brush members, a mechanism for supplying pure water to the upper and lower brush members, a mechanism for carrying the substrate between the upper and the lower brush members to reciprocate it relative to the upper and lower brush members in a substrate carrying direction, and a controller for controlling the operation of the substrate carrying mechanism.

9 Claims, 12 Drawing Sheets

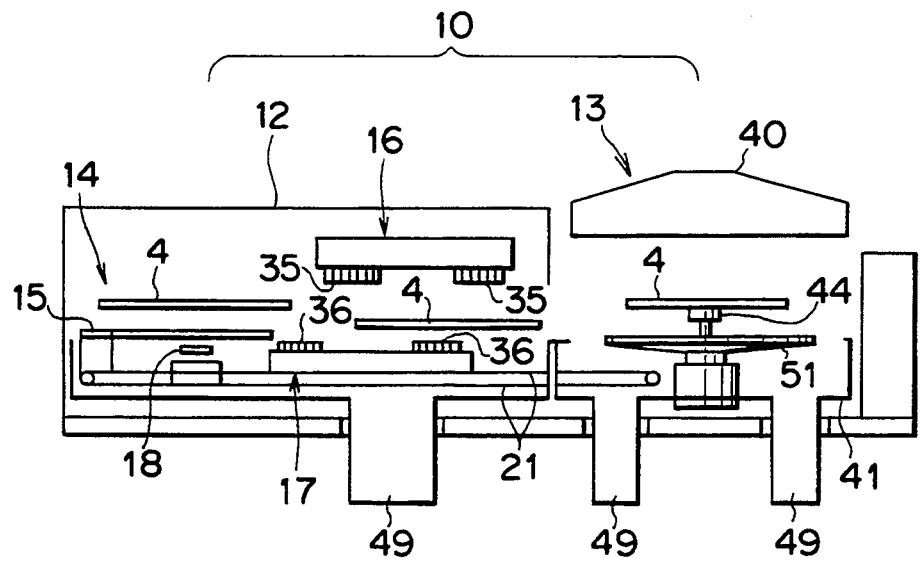
F I G. 2
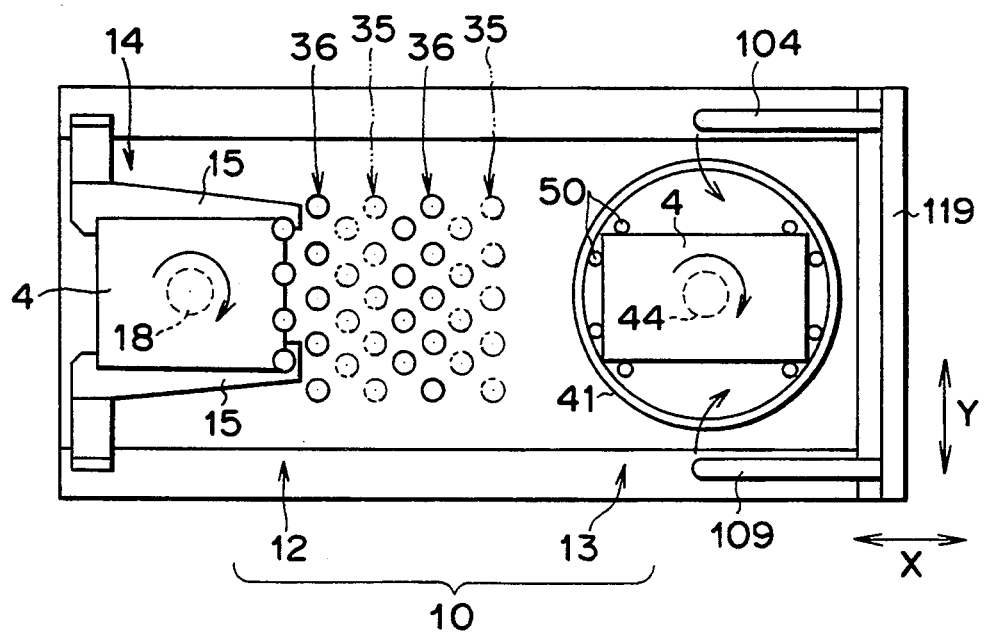
F I G. 3

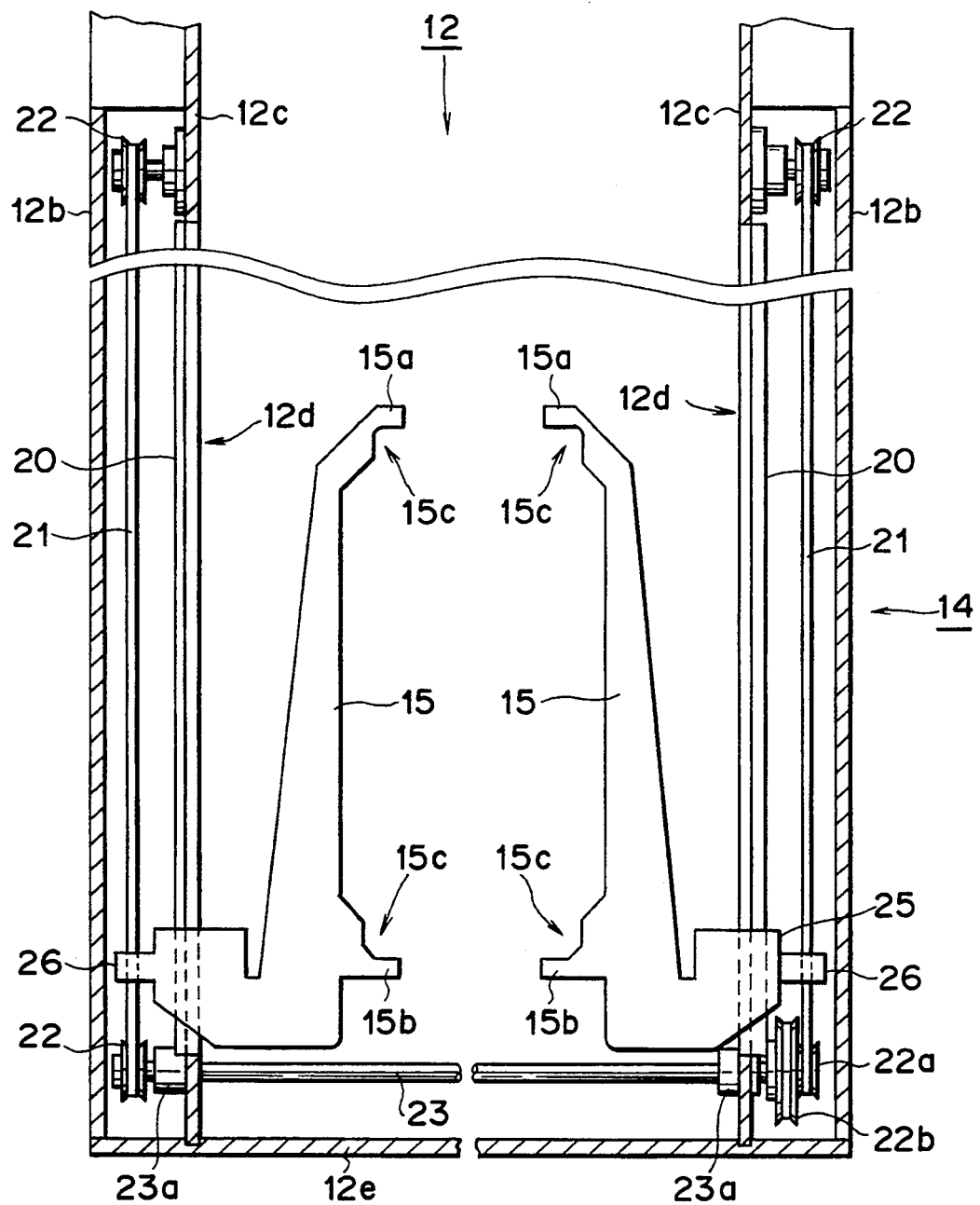
F I G. 6

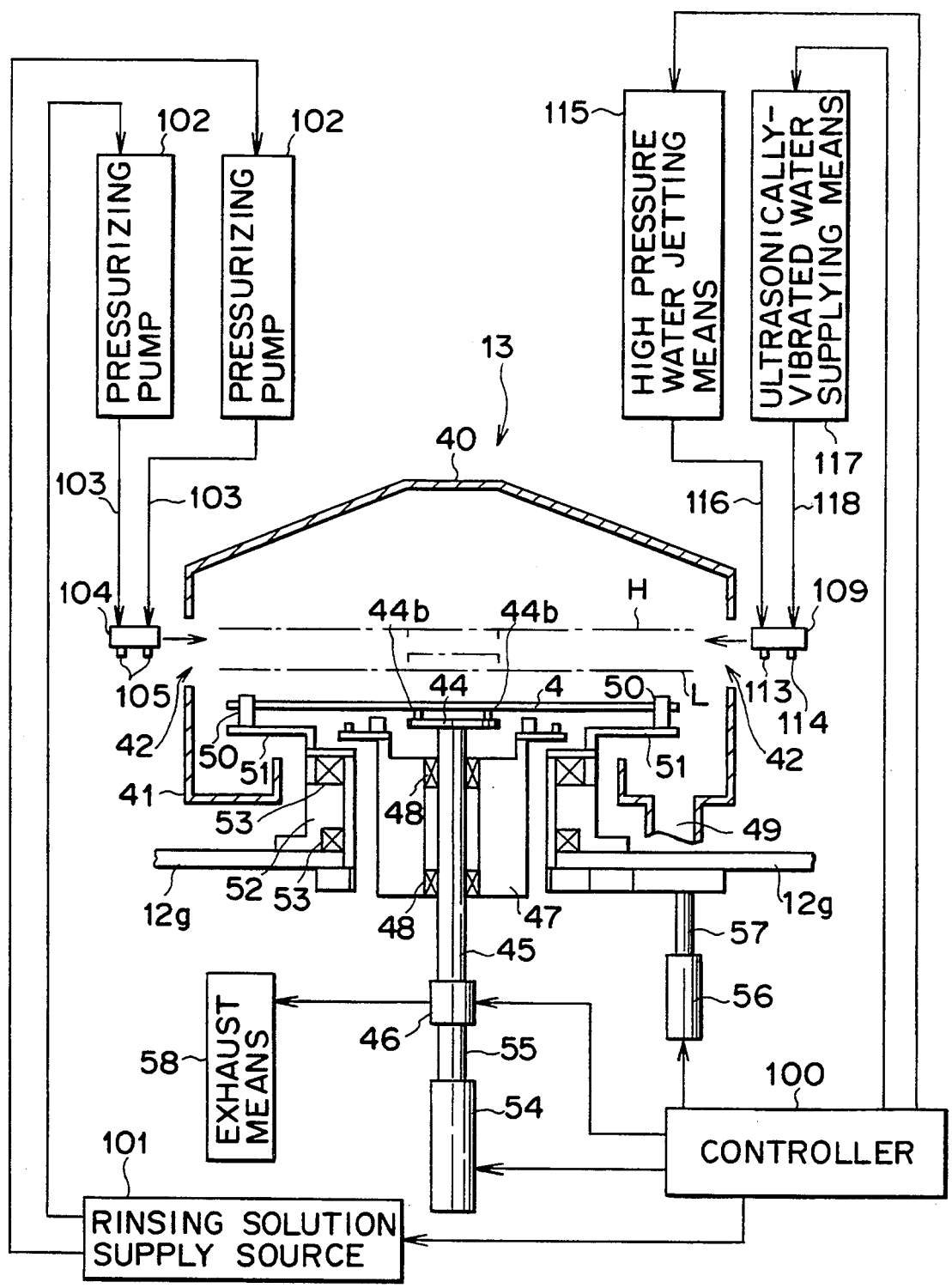
F I G. 10

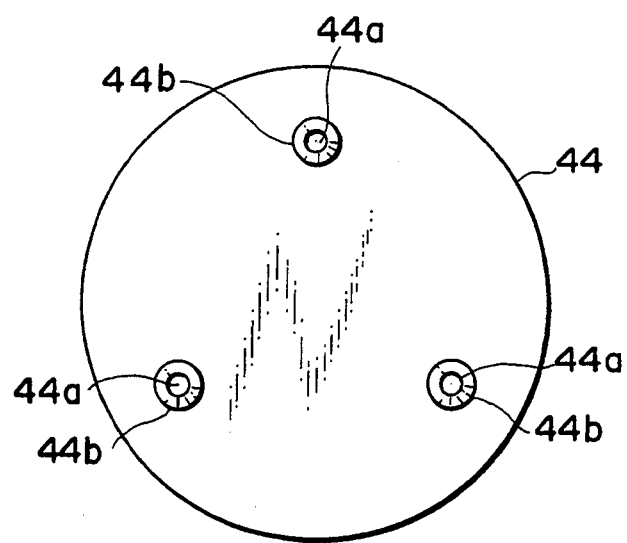
F I G. 11
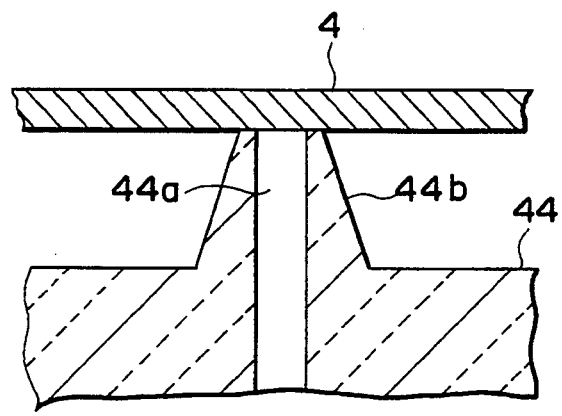
F I G. 12

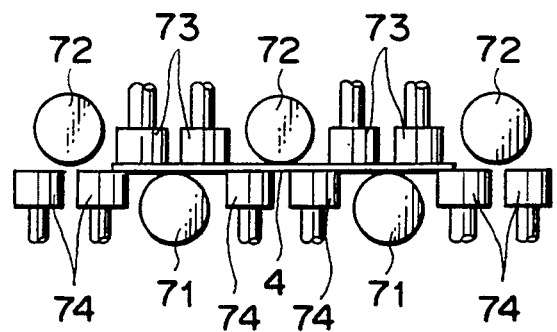
F I G. 14
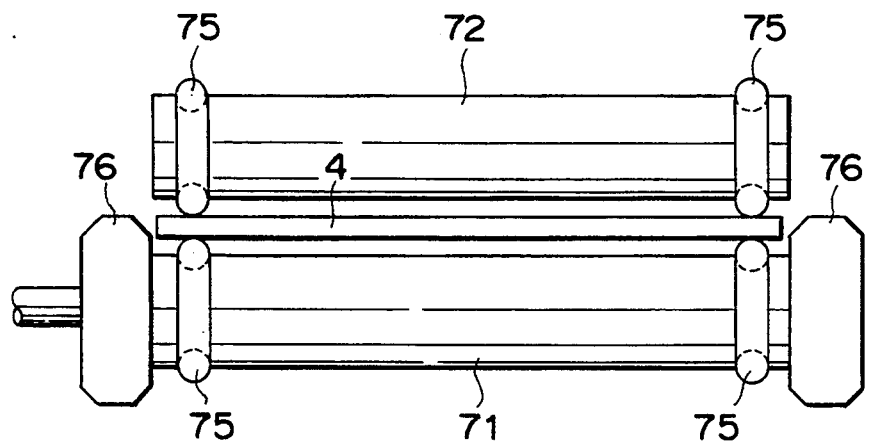
F I G. 15

DEVICE AND METHOD FOR SCRUBBING AND CLEANING SUBSTRATE

BACKGROUND OF THE INVENTION

1. Field of the Invention

The present invention relates to a device and a method for scrubbing and cleaning a substrate for the liquid crystal display (LCD) by brushes while applying a solution to the substrate.

2. Description of the Related Art

It is quite important in the course of making the LCDs to finish each glass substrate clean and smooth. For this purpose, both surfaces of the LCD glass substrate are scrubbed by brushes while applying cleaning solution to the substrate. Foreign substances such as particles and grains which have adhered to the surfaces of the substrate are thus removed from them. The scrubber is used to scrub the LCD glass substrate in this manner. The scrubber includes a mechanism for carrying the substrates successively and brushes made of soft fibers such as nylon or mohair.

Particles and grains firmly adhere to the surfaces of the glass substrate. It is therefore impossible to completely remove the particles from the substrate unless an extended scrubbing time is provided. In the case of the conventional scrubbers, the scrubbing time is made long by making the substrate carrying passage long and the substrate carrying speed low. When the substrate carrying passage is made long, however, the device must be made large in size. When the substrate carrying speed is made low, the scrubbing and cleaning efficiency becomes low.

The conventional device includes, as the mechanism for removing particles and grains from the substrate, a water jet cleaning mechanism for jetting high pressure water of higher than 100 Kg/cm$^2$ to the substrate or a ultrasonic cleaning mechanism for supplying water, to which ultrasonic vibrations having a frequency of about 1 MHz have been applied, to the substrate.

However, in the case of the water jet cleaning mechanism it is difficult to make the flow rate of high pressure water jetted sufficiently large. The maximum flow rate achieved by the water jet cleaning mechanism is only about 0.5 l/min. The amount of water jetted is therefore insufficient to wash out particles and grains from the substrate only by jetted water. This makes it necessary to add a rinse mechanism to the water jet cleaning mechanism wherein a large amount of rinsing solution (or pure water) is supplied to the top surface of the substrate through the rinse mechanism to completely remove particles from it. Pure water having a pressure of 1-2 Kg/cm$^2$ as supplied to the substrate at a flow rate of several litters per minute through the rinse mechanism.

Recently, the LCD glass substrates are becoming larger and larger in size. In addition, it is desired for the substrate processing capacity in each manufacturing section to become higher and for the productivity to become higher accordingly. The conventional techniques are insufficient to meet the needs. This asks the scrubbing and cleaning capacity to be made higher.

SUMMARY OF THE INVENTION

An object of the present invention is therefore to provide a scrubbing and cleaning device, more functional and more compact, but capable of scrubbing substrates such as LCD ones each having a large area.

Another object of the present invention is to provide a scrubbing and cleaning method having a higher rinsing capacity (even after the scrubbing process) and which is capable of cleaning substrates, such as LCDs ones each having a large area, at a higher speed.

According to an aspect of the present invention, there can be provided a scrubbing and cleaning device comprising means having an upper and a lower brush members for scrubbing both surfaces of a substrate; means for rotating the upper and lower brush members, respectively; means for supplying cleaning solution to the upper and lower brush members, respectively; means for carrying the substrate between the upper and the lower brush members and for reciprocating the substrate relative to the upper and lower brush members in a substrate carrying direction; and means for controlling the operation of the substrate carrying means.

According to the scrubbing and cleaning device, the substrate is reciprocated between the upper and the lower brush members to enable the substrate to be maintained at the scrubbing position for a longer time. This enables the substrate scrubbing time to be extended to more completely clean the substrate. In addition, the device can be made more compact in size but clean large-sized substrates at a higher speed.

Further, the substrate cleaning device includes a mechanism for supplying water to each brush through the center of the brush to clean the brush itself when the brushes are left inoperative. This makes it possible to clean the brushes without supplying pure water to them through rinsing nozzles. This also make it possible to prevent the brushes from being deformed by high pressure pure water supplied through the substrate cleaning rinse nozzles. The running cost can be thus made lower and the frequency of maintaining the device can also be reduced.

According to another aspect of the present invention, there can be provided a scrubbing and cleaning method comprising carrying a substrate to scrubbing means; scrubbing both surfaces of the substrate by the scrubbing means while spraying cleaning solution onto them when the substrate is being carried; rinsing the substrate while applying rinsing solution to the substrate; and rotating the substrate to remove solution adhered from the substrate by centrifugal force so as to make it dry.

It is preferable that a rinsing solution is sprayed to the substrate under pressure. Particularly when rinsing solution is pressurized to 10–20 Kg/cm$^2$, matters such as particles adhered to the substrate can be more completely removed from the substrate. According to the conventional methods, the substrate was rinsed by a rinsing solution which had the pressure of 1–2 Kg/cm$^2$ and this made it difficult to completely remove matter such as particles, which had firmly adhered to the substrate, from the substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a front view schematically showing the substrate scrubbing device according to a first embodiment of the present invention;

FIG. 3 is a plan schematically showing the substrate scrubbing device;

FIG. 6 is a plan showing the substrate carrying mechanism when viewed from top;

FIG. 10 is a block diagram showing a rinsing device partly cut out;

FIG. 11 is a plan showing a substrate holder mechanism of the rinsing device;

FIG. 12 is a sectional view showing a part of the substrate holder mechanism enlarged;

FIG. 14 is a side view showing scrubbing brushes and substrate carrying rollers;

FIG. 15 is a partly-enlarged view showing the substrate carrying mechanism when viewed in the substrate-carrying direction;

DETAILED DESCRIPTION OF THE PREFERRED EMBODIMENTS

Some cases where the device of the present invention is used to clean LCD substrates will be described with reference to the accompanying drawings.

Figure 1:
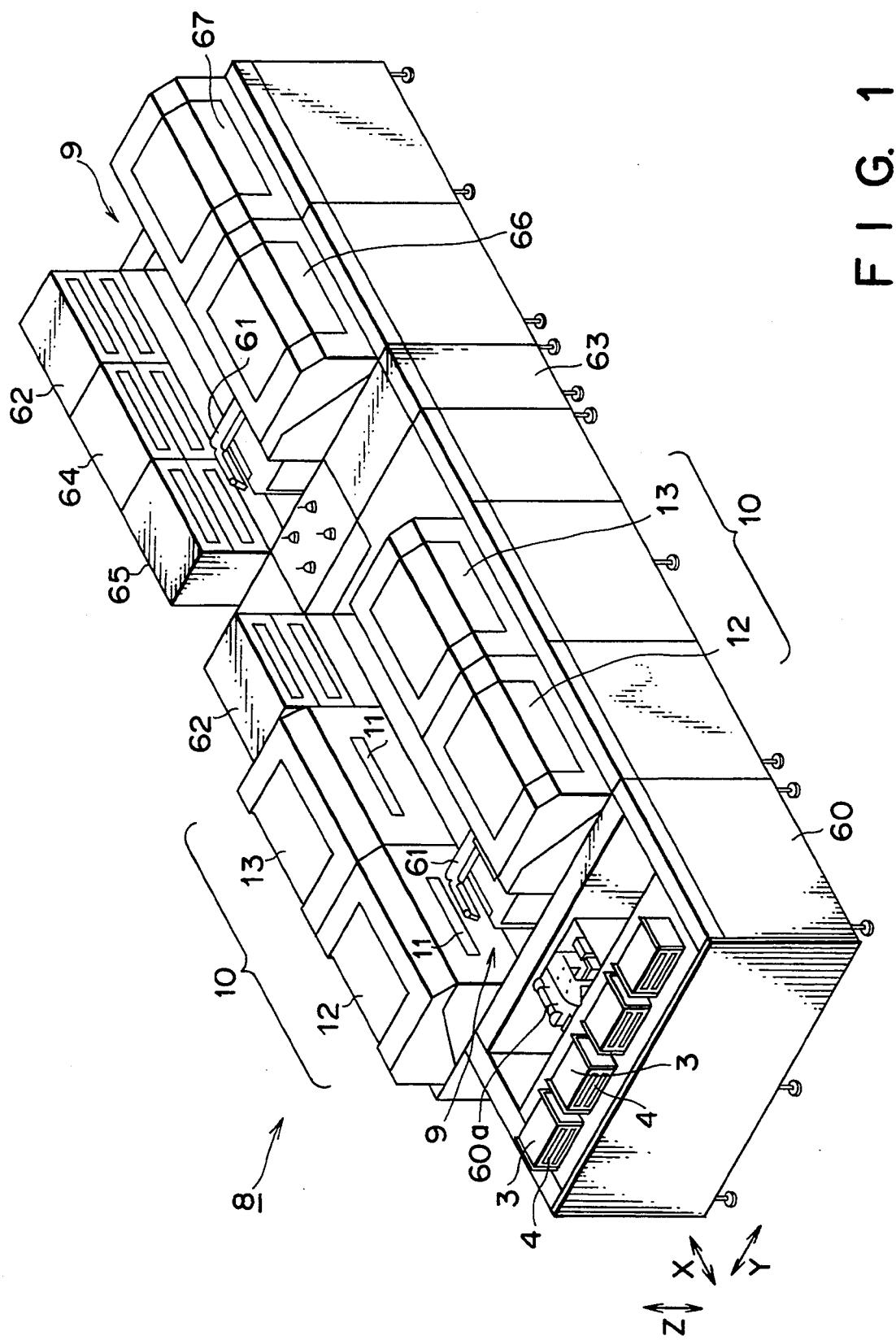
FIG. 1 is a perspective view showing the resist processing system into which the device for scrubbing LCD glass substrates by a brush as incorporated.

As shown in FIG. 1, a cassette station 60 is located at one end of a resist processing system 8 to receive plural cassettes 3. A plurality of LCD glass substrates 4 are housed in each of the cassettes 3. The substrates 4 are taken out of the cassette 3 one by one and carried to a transfer section 60a by a tweezers mechanism (not shown).

The resist processing system 8 includes two process sections and a connecting unit (or transfer section) 63 is arranged between these two sections. Each of the sections includes a substrate carrying passage 9 along which a robot 61 can run. The robot 61 serves to carry the substrate 4 from the transfer section 60a into the process section and also from the process section to the transfer section 60a. A pair of substrate cleaning units 10 are opposed to each other in the first process section with the passage 9 interposed between them. Units 62, 64, 65, 66 and 67 are arranged on both sides of the passage 9 in the second process section.

Each of the substrate cleaning units 10 includes scrubber (or brush-scrubbing) chamber 12 and rinse chamber 13. A slit opening 11 is formed in the front face of the scrubber chamber 12 which is directed to the passage 9 and the substrate 4 is carried into the scrubber chamber 12 through the slit opening 11. A slit opening 11 is also formed in the front face of the rinse chamber 13 which is directed to the passage 9 and the substrate 4 is carried out of the rinse chamber 13 through the slit opening 11.

The unit 62 serves as a unit for heating the substrate 4. The unit 64 serves as a unit for cooling the substrate 4. The unit 65 serves as an adhesion unit for adhesion-processing the substrate 4. The unit 66 serves as a unit for coating the substrate 4 with resist. The unit 67 serves as a unit for developing the substrate 4. An exposing unit (not shown) is connected to the second process section.

As shown in FIGS. 2 and 3, the scrubber chamber 12 and rinse chamber 13 are made as a continuous unit and the substrate 4 is scrubbed in the scrubber chamber 12 and then rinsed with a rinse solution in the rinse chamber 13. A substrate carrying mechanism 14 and a pair of scrubbing brush mechanisms 16 and 17 are arranged in the 10 scrubber chamber 12.

A nozzle unit 104 for pressurized water and another nozzle unit 109 for high pressure water and ultrasonic cleaning are arranged in the rinse chamber 13. Each of the nozzle units 104 and 109 is made swingable around its base point. The rinse chamber 13 comprises a hood 40 and a container 41, by which a substrate holder mechanism 44 is enclosed. A holder mechanism 18 is located adjacent to the substrate carrying-in opening 11 and the holder mechanism 44 is located adjacent to the substrate carrying-out opening 11. Each of the holder mechanisms 18 and 44 has a vacuum chuck and lifter and rotating mechanism, serving to lift the substrate 4 and rotate it by 90 degrees while vacuum-attracting and holding the substrate 4. Namely, the substrate 4 is rotated by 90 degrees in the scrubber chamber 12 to align its long sides with an X axis (or its carrying) direction.

The substrate carrying mechanism 14 will be described referring to FIGS. 4 through 7.

Figure 4:
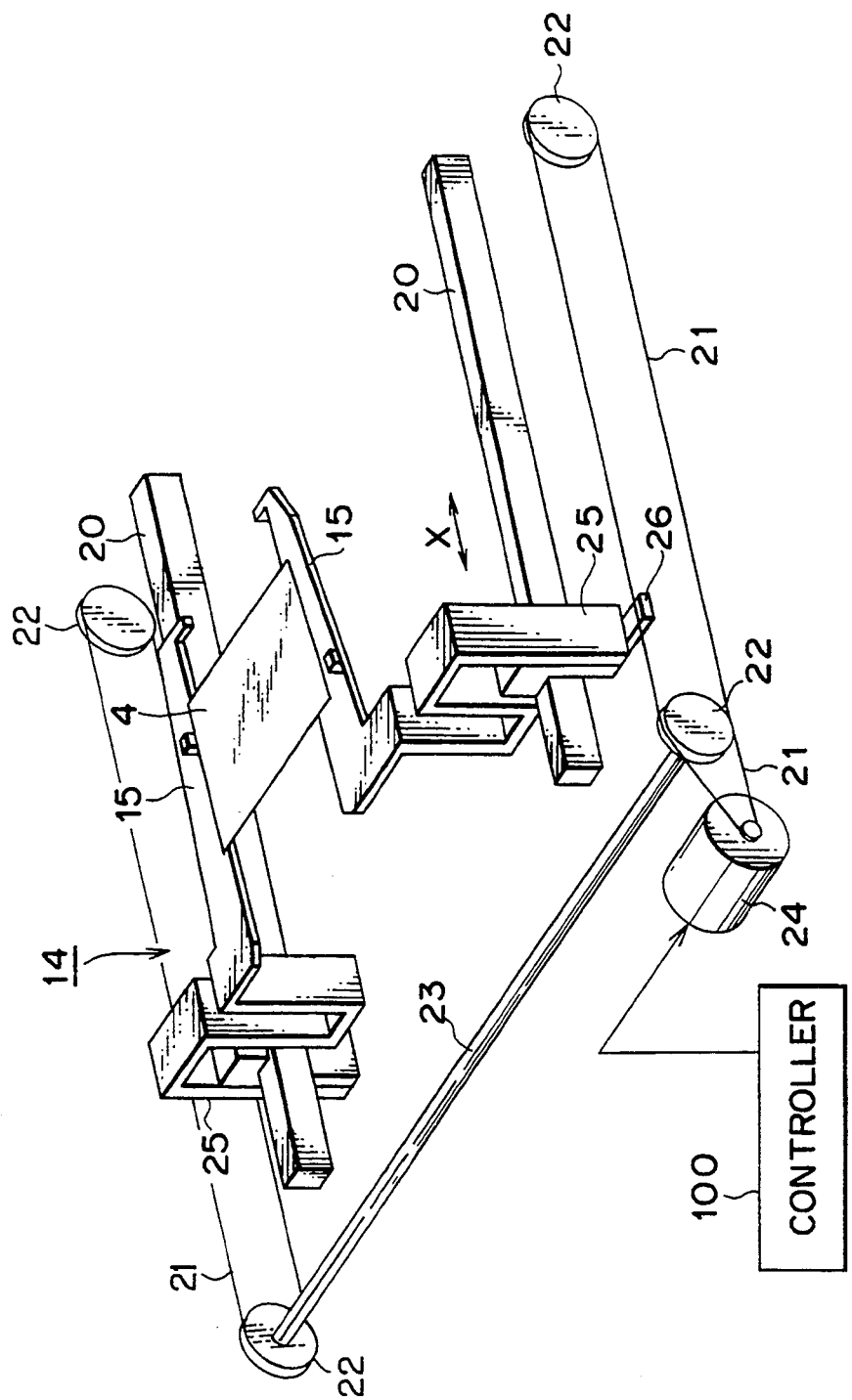
FIG. 4 as a perspective view showing a mechanism for carrying LCD glass substrates.

As shown in FIG. 4, the substrate 4 is held by a pair of arms 15. The substrate carrying mechanism 14 includes a pair of belts 21 and pulley 22 driven by a motor 24 and the substrate 4 is held between the paired arms 15. The holding arms 15 and the timing belts 21 are connected by connecting members 26 and the arms 15 can be thus moved on linear guide rails 20 by the belts 21. The motor 24 is connected to the output section of a controller 100 and controlled according to a predetermined recipe by the controller 100 to slowly reciprocate the arms 15 in the X axis direction.

Figure 5:
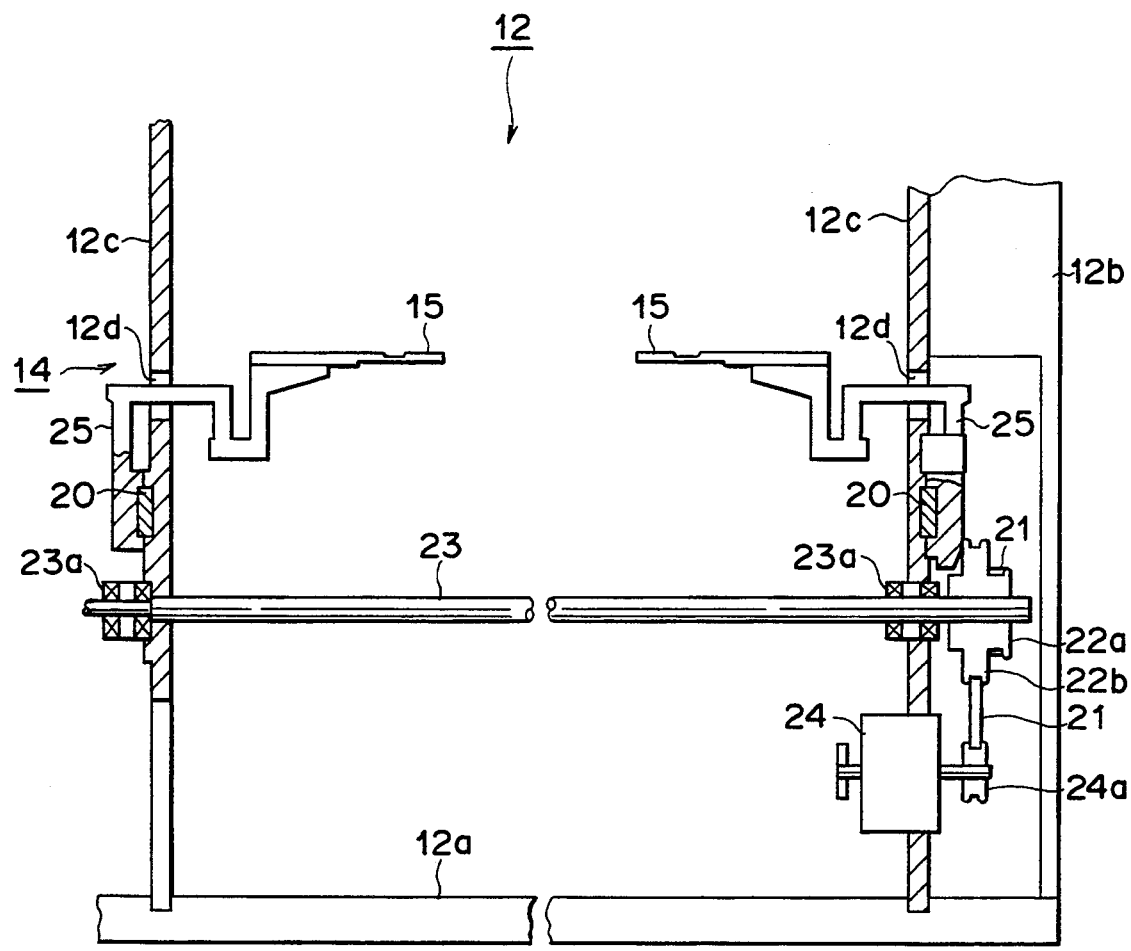
FIG. 5 is a partly-sectioned view showing the substrate carrying mechanism when viewed in a substrate-carrying direction.

As shown in FIG. 5, a pair of side walls each comprising double walls 12b and 12c are erected from a floor 12a of the scrubber chamber 12 and belt means 21, 22a and 22b are housed between the double walls 12b and 12c of each of the paired side walls. The linear guide rails 20 are fixed to the inner walls 12c and the motor 24 is fixed to one of the inner walls 12c. The holding arms 15 are supported by support sliders 25, which are slidably attached to the linear guide rails 20, passing through openings 12d of the inner walls 12c. A shaft 23 passes through the paired inner walls 12c and small and large pulleys 22a and 22b are attached to one end of the shaft 23. Bearings 23a for the shaft 23 are attached to the inner walls 12c.

Figure 7:
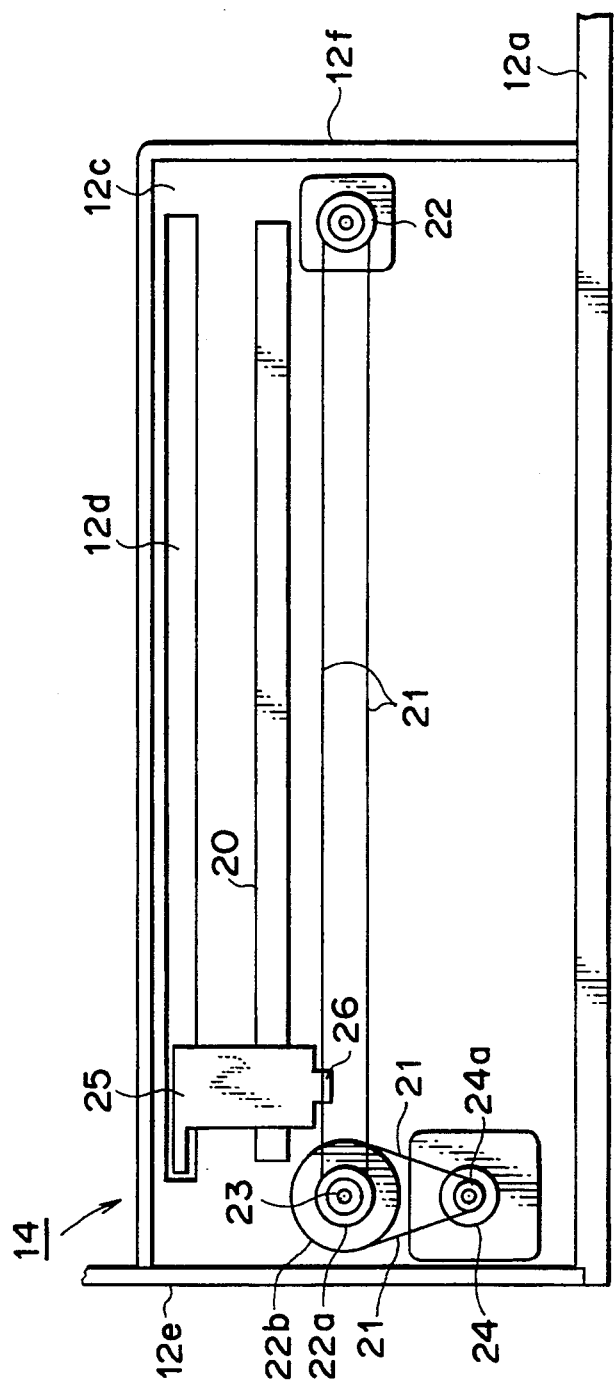
FIG. 7 is a side view showing the substrate carrying mechanism.

As shown in FIGS. 6 and 7, the belt 21 is stretched between the small pulley 22a and the large 22b. Another belt 21 is also stretched between the large 22b and a drive pulley 24a. The linear guide rails 20 and the openings 12d extend from near a side wall 12e to near a side wall 12f.

As shown in FIG. 6, projections 15a and 15b are projected inwards from fronts and bases of the arms 15 to form recesses 15c for holding four corners of the substrate 4.

The upper and lower brush mechanisms 16 and 17 will now be described.

As shown in FIG. 3, the upper brush mechanism 16 has a group of two lines of brushes 35 and the lower brush mechanism 17 also has a group of two lines of brushes 36. The brushes 35 of one line of the upper brush mechanism 16 are alternately shifted from those of the other line and same thing can be said about the brushes 36 of the lower brush mechanism 17. In addition, the brushes 35 and 36 of those lines of the upper and lower brush mechanisms 16 and 17 which are adjacent to each other are also alternately shifted or off-set from one another. Each of the brushes 35 and 36 is made by nylon or mohair fibers.

Figure 8:
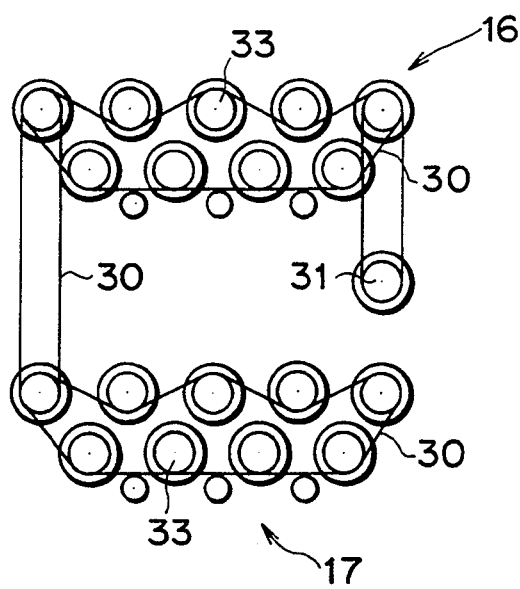
FIG. 8 is a plan schematically showing a scrubbing brush assembly and a mechanism for driving the assembly.

As shown in FIG. 8, timing belts 30 extend around brush bodies 33 of the upper and lower brush mechanisms 16 and 17 and when the timing belts 30 are driven by a drive shaft 31 of a motor (not shown), the upper and lower brushes 35 and 36 are rotated round their own axes. The upper and lower brush mechanisms 16 and 17 are supported by lifter means (not shown).

Figure 9:
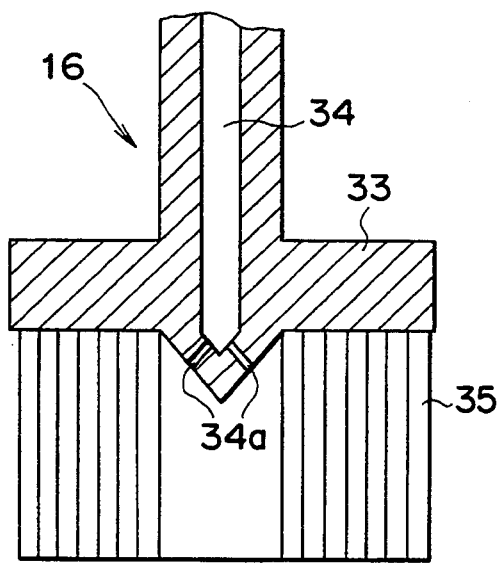
FIG. 9 is a vertically-sectioned view showing the main portion of a scrubbing brush.

As shown in FIG. 9, brush fibers of each brush 35 of the upper brush mechanism 16 are planted on the lower surface of the brush body 33 but leaving a space at the center portion of the lower surface. A passage 34 is opened at this space through plural nozzles 34a. The passage 34 is communicated with a rinsing solution supply source 101 through a pump 102. Each of the nozzles 34a is directed to brush fibers of each brush 35 to clean the brush fibers themselves and to prevent them from becoming dried. It is preferable that the pressure under which rinse solution is supplied into the passage 34 by the pressurizing pump 102 is in a range of 10–20 Kg/cm² (or relatively low). Because the brushes 35 are deformed when the supply pressure of rinsing solution is too high. It is preferable that pure water is used as a rinsing solution. The lower brush mechanism 17 also has the same design as that of the above-described upper brush mechanism 16.

The rinse chamber 13 and its accessories will be described with reference to FIGS. 10 through 12.

As shown in FIG. 10, the container 41 forms the lower portion of the rinse chamber 13 and waste solution is drained outside through a drain 49. The substrate holder mechanism 44 is inserted into the rinse chamber 13 through a center opening of the container 41 to hold the substrate 4 thereon. A shaft 45 of the substrate holder mechanism 44 is rotatably supported by a block 47 through bearings 48. The lower end of the shaft 45 is connected to the drive shaft of a motor 46. Further, a rod 55 of an air cylinder 54 is connected to the body of the motor 46 so that the substrate holder mechanism 44 can be lifted to a position L or H.

Plural posts 50 are erected from a disk stage 51. Posts 50 are contacted with four corners of the substrate 4 to position it. The disk stage 51 is rotatably attached to a fixing block 52 through a pair of bearings 53. A drive force transmitting member 57 of a drive means 56 is connected to the underside of the disk stage 51 to rotate the disk stage 51 at a high speed of about 3000 rpm.

As shown in FIG. 11, the top of the substrate holder mechanism 44 is shaped like a disk and three projections 44b are projected from this disk-like top of the substrate holder mechanism 44. As shown in FIG. 12, an exhaust passage 44a is opened at the top of each projection 44b. As shown in FIG. 10, the exhaust passage 44a of each projection 44b is communicated with an exhaust means 58 through the motor 46. When the exhaust passages 44a are exhausted, the substrate 4 is attracted and held onto the projections 44b. Each projection 44b is made of corrosion-resistant resin such as polyacetal (trade mark Delrin) or ceramics. The holder mechanism 18 in the scrubber chamber 12 also has same design as that of this holder mechanism 44.

The rinsing solution supply mechanism and the high pressure water/ultrasonic cleaning mechanism will be described.

As shown in FIGS. 3 and 10, the nozzle unit 104 of the rinsing solution supply mechanism and the one 109 of the high pressure water/ultrasonic cleaning mechanism are arranged on both sides of the rinse chamber 13. These two nozzle units 104 and 109 are moved in a Y axis direction by a drive means 119 to come into and out of the rinse chamber 13 through side openings 42 of the chamber 13. The nozzle units 104 and 109 extend in the X axis direction.

The nozzle unit 104 has nozzles 105 of two lines. The nozzles 105 of each line are in communication with a pressurizing pump 102 through a conduit 103 and two pressurizing pumps 102 are in communication with a rinse solution supply source 101. Pure water is stored as rinsing solution in the rinse solution supply source 101.

The nozzle unit 109 also has nozzles 113 and 114 of two lines. The nozzles 113 are in communication with high pressure jet means 115 through a conduit 116 while the nozzles 114 with a ultrasonic water current supply means 117 through a conduit 118. The high pressure jet means 115 houses therein a source for supplying high pressure jet water of 100–150 Kg/cm². The ultrasonic water current supply means 117 also houses therein a vibrator for generating ultrasonic waves which have a frequency of 1 MHz, and a source for supplying pure water. It is preferable that ultrasonic waves have the frequency of 1 MHz, but those having a frequency of 1 a 0.2 MHz can be used.

The rinse solution supply source 101, the pressurizing pumps 102, the high pressure jet means 115 and the ultrasonic water current supply means 117 are controlled according to a predetermined recipe by the controller 100.

A case where LCD glass substrates are cleaned by the above-described device will be described.

The substrate 4 is taken out of the cassette 3 and carried to the transfer section 60a. It is picked up from the transfer section 60a, carried to the front of the scrubber chamber 12 and then into the scrubber chamber 12 through the opening 11 by the robot 61.

When the substrate 4 is mounted on the holder mechanism 18 it is attracted and held and then lifted by the holder mechanism 18 and the arm of the robot 61 is retreated. The holder mechanism 18 is rotated to shift 90 degrees an orientation of the substrate 4 in the horizontal plane. Long sides of the substrate 4 are along the X axis under this state. The holder mechanism 18 is lowered and the substrate 4 is transferred from the holder means 18 to the carrying arms 15. The arms 15 are moved forward to position the substrate 4 between the upper 16 and the lower brush mechanism 17. The brushes 35 and 36 are rotated round their own axes. The upper brush mechanism 16 is lowered to contact its brushes 35 with the top surface of the substrate 4 while the lower brush mechanism 17 is lifted to contact its brushes 36 with the bottom surface of the substrate 4. Pure water is jetted this time onto both surfaces of the substrate 4 through the nozzle holes 34a of brushes 35 and 36.

The motor 24 is alternately rotated forward and backward to reciprocate the carrying arms 15 at a speed of 0.05-0.15 m/min. The substrate 4 is reciprocated slowly relative to the brushes 35 and 36. As the result, the scrubbing time is made longer to more cleanly scrubbing the substrate 4. Even after the brushes 35 and 36 are separated from the substrate 4, the substrate 4 may be rinsed while jetting rinsing solution onto both surfaces of the substrate 4. After the substrate 4 is scrubbed for a certain time by the upper and lower brushes 35 and 36 in this manner, it is carried into the rinse chamber 13 by the carrying means 14.

When the substrate 4 is positioned at the position L and the holder mechanism 44 is elevated to the position H, the substrate 4 is transferred from the carrying arms 15 to the holder mechanism 44, as shown in FIG. 10. It is attracted and held by the holder mechanism 44. The carrying arms 15 are retreated from the rinse chamber 13 and the holder mechanism 44 is lowered. The substrate 4 is thus transferred from the holder mechanism 44 to the state 51.

The nozzle unit 109 is positioned just above the substrate 4 and either high pressure jet water or ultrasonic water is supplied to the substrate 4. Both of high pressure jet water and ultrasonic water may be supplied to the substrate 4 in this case. The substrate 4 is rinsed this time while rotating the stage 51 at low speed. The pressure of high pressure jet water is 100-150 Kg/cm$^2$ and its maximum flow rate is 0.5 l/min. The substrate 4 may be further rinsed under a water pressure of 10-20 Kg/cm$^2$ and at a flow rate of 2-10 l/man while stopping the generation of ultrasonic waves.

The nozzle unit 109 is retreated from the rinse chamber 13 while the nozzle unit 104 is moved into the rinse chamber 13. Pure water is sprayed onto the substrate 4 under the water pressure of 10-20 Kg/cm$^2$ and at the flow rate of 2-10 l/min through the nozzle unit 104 to rinse the substrate 4. The water pressure may be low or in a range of 1-2 Kg/cm$^2$ a the case of this rinsing process.

When the rinsing or cleaning process is finished, the stage 51 is rotated at high speed to remove solution adhered from the substrate 4 by centrifugal force. The substrate 4 is thus made dry. It is lifted to the position H by the holder mechanism 44 and positioned just under the arm of the robot 61. When the holder mechanism 44 is lowered, it is transferred from the holder mechanism 44 to the arm of the robot 61.

Thereafter, the substrate 4 is carried to the units 62, 64, 65, 66 and 67 by the robot 61 and adhesion-processed, dried by heat, cooled, resist-coated and based in these units. It is then exposed and developed. When its process is finished in this manner, it is then returned to the cassette station 60 by the robot 61.

According to the above-described first embodiment of the present invention, the substrate 4 can be reciprocated between the upper 16 and the lower brush mechanism 17 by the carrying mechanism 14. This enables the substrate 4 to be scrubbed for a longer time in the scrubber chamber 12 which is shorter and smaller in size. The device can be thus made more compact in size.

Further, high pressure water is not jetted directly to the upper and lower brushes 35 and 36. This prevents the upper and lower brushes 35 and 36 from being deformed by high pressure water, thereby enabling them to have a longer life.

Although the above-described embodiment has been used to scrub LCD glass substrates, the present invention is not limited to the LCD glass substrates but it can be used to scrub such substrates as semiconductor wafers, photo-masks, ceramic substrates, compact disks and printed substrates.

A second embodiment of the present invention will be described referring to FIGS. 13 through 18.

Figure 13:
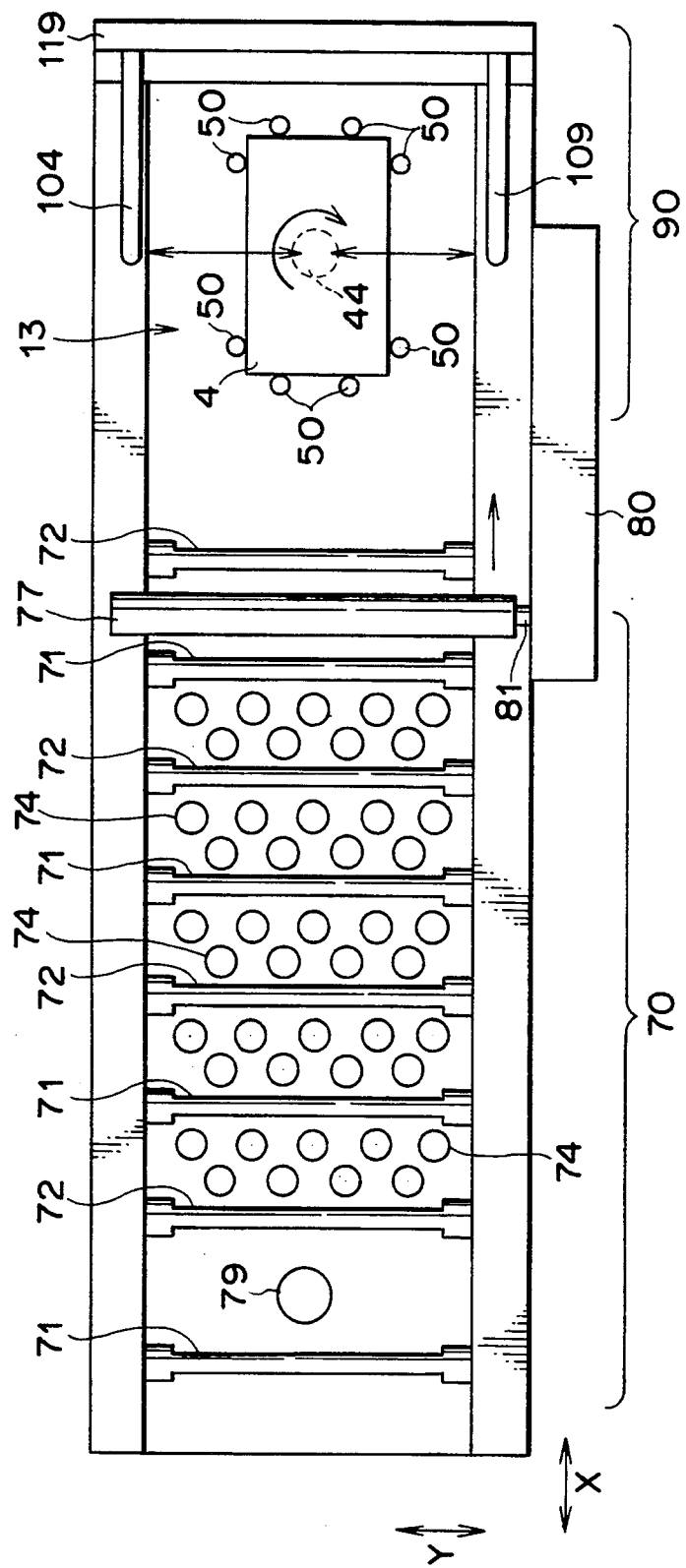
FIG. 13 is a plan schematically showing the substrate scrubbing device according to a second embodiment of the present invention.

As shown in FIG. 13, a substrate carrying mechanism of the second embodiment has plural upper and lower rollers 71 and 72 which are horizontally and alternately arranged in a scrubber chamber 70. A substrate holder mechanism 79 is located upstream of a substrate carrying passage which is formed by the rollers 71 and 72, and a lift holder 77 is located downstream the substrate carrying passage. The substrate holder mechanism 79 has same design as that of the above-described holder mechanisms 18 and 44. The lift holder 77 is moved in X and Z axes directions by a drive means 80 and its sucking section 87 is exhausted.

As shown in FIG. 14, upper brushes 73 are arranged between the lower roller 71 and upper roller 72, and lower brushes 74 are arranged between the lower roller 71 and upper roller 72. The upper brushes 73 between the upper rollers 72 are arranged in side by side two lines in the traverse direction and same thing can be said about the lower brushes 74 between the lower rollers 71. The upper brushes 73 between the upper rollers 72 face their corresponding lower roller 71 while the lower brushes 74 between the lower rollers 71 face their corresponding upper roller 72. The upper and lower brushes 73 and 74 are rotated round their own axes.

As shown in FIG. 15, a pair of O-rings 75 are fitted round both ends of each of the upper and lower rollers 71 and 72 and these O-rings 75 are contacts directly with both side rims of the substrate 4. Each of the O-rings 75 is made of rubber of the fluorine group, FPM, propylene hexafluoride or vinylidene fluoride copolymer. Further, guides 76 are attached to both ends of each of the lower rollers 71 and the substrate 4 is guided to the center of the carrying passage by these guides 76. Axes of the lower rollers 71 are connected to a drive motor (not shown) but the upper rollers 72 are supported idle. It may be arranged in this case that the upper rollers 72 are driven by a drive motor.

Figure 16:
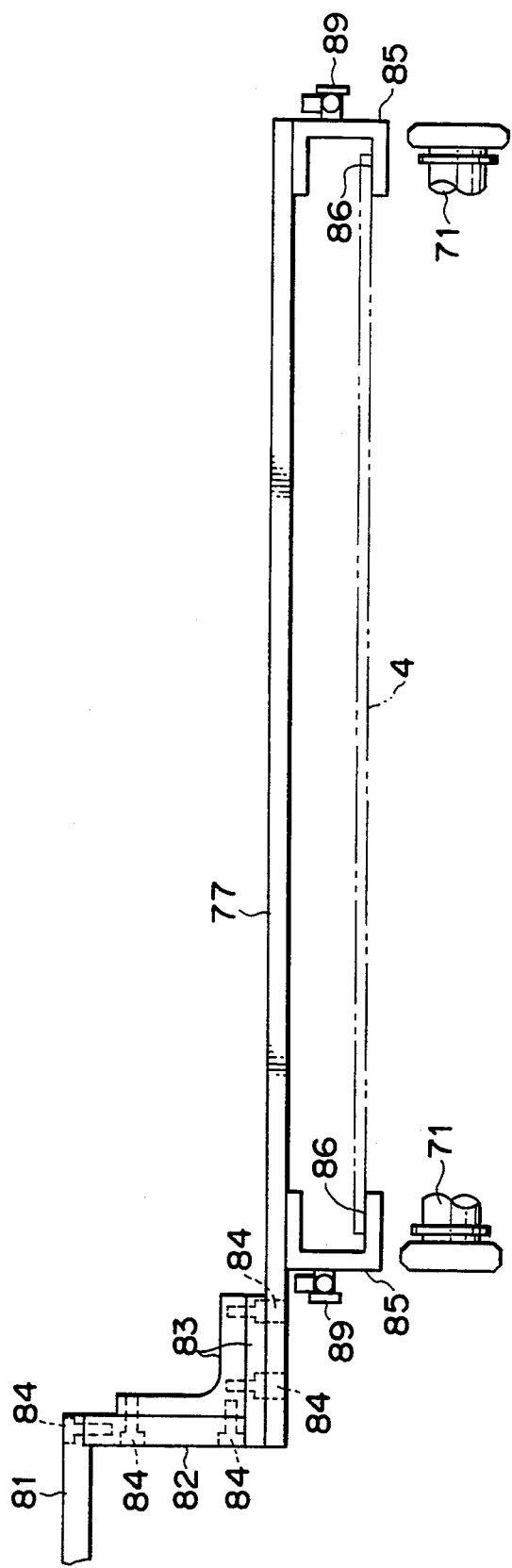
FIG. 16 is a view showing a substrate lifting and holding mechanism when viewed in the substrate-carrying direction.

As shown in FIG. 16, the lift holder 77 is connected to movable members (not shown) of the drive mechanism 80 ,by members 81, 82, 83 and 84. A pair of holder members 85 are attached to the lower portion of the lift holder 77 and both sides of the substrate 4 are seated in recesses of the holder members 85 by about 100 mm when measured from the rim of each of both sides thereof. The lift holder 77 is positioned a little higher than the level of the lower rollers 71 and the substrate 4 is carried at this height.

Figure 18:
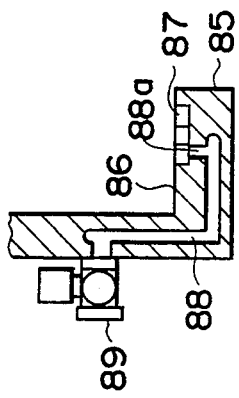
FIG. 18 is a sectional view showing a part of the substrate lifting and holding mechanism enlarged.
Figure 17:
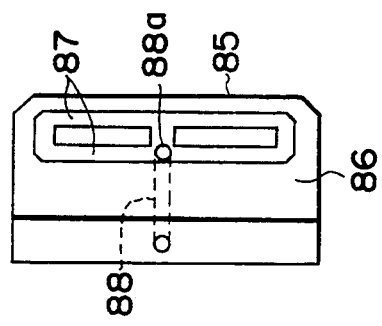
FIG. 17 is a plan showing a part of the substrate lifting and holding mechanism.

As shown in FIGS. 17 and 18, a groove 87 is formed in a face 86 of the recess of each holder member 85 and a inner passage 88 in the holder member 85 is communicated with the groove 87 through an opening 88a. In addition, the passage 88 is communicated with an exhaust means (not shown) through a connecting member 89 and a hose (not shown).

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A substrate scrubbing and cleaning device, comprising:
    means having upper and lower brush members for scrubbing both surfaces of a substrate, respectively;
    means for rotating the upper and lower brush members, respectively;
    means for supplying cleaning solution to the upper and lower brush members, respectively;
    means having a pair of belt-driven holding arms, for carrying the substrate between the upper and lower brush members and for reciprocating the substrate relative to the upper and lower brush members in a substrate carrying direction, the substrate being held by said holding arms; and
    means for controlling the operation of the substrate carrying means.

2. The device according to claim 1, further comprising nozzle means through which high pressure water is jetted onto the substrate.

3. The device according to claim 1, further comprising nozzle means through which spraying water, to which ultrasonic waves have been applied, is sprayed onto the substrate.

4. The device according to claim 1, further comprising nozzle means through which large amount of rinsing solution is supplied to the substrate.

5. The device according to claim 1, wherein said cleaning solution supply means includes a passage opening at a center of each brush member.

6. The device according to claim 1, wherein the upper brush members are off-set from their adjacent lower brush members in a horizontal plane.

7. The device according to claim 1, further comprising means for holding by suction, lifting and rotating the substrate.

8. A scrubbing and cleaning device comprising:
    means having an upper and a lower brush members for scrubbing both surfaces of a substrate, respectively;
    means for rotating the upper and lower brush members, respectively;
    means for supplying cleaning solution to the upper and lower brush members, respectively;
    means having upper rollers each being arranged between the upper brush members and also having lower rollers each being arranged between the lower brush members and serving to carry the substrate between the upper and the lower brush members by the upper and lower rollers;
    lift holder means for receiving the substrate from the carrying means to hold and lift the substrate; and
    stage means for receiving the substrate from the lift holder means and for rotating the substrate thereon while applying a rinsing solution to the substrate.

9. The device according to claim 8, wherein said lift holder means has members for attracting and holding both side portions of the substrate.

* * * * *